United States Patent
Kitamura et al.

(10) Patent No.: US 8,551,819 B2
(45) Date of Patent: Oct. 8, 2013

(54) METHOD FOR SURFACE MOUNTING USING CLEANING-FREE ACTIVATED RESINOUS COMPOSITION

(75) Inventors: Kazunori Kitamura, Saitama-ken (JP); Yasuhiro Takase, Saitama-ken (JP)

(73) Assignee: San-Ei Kagaku Co., Ltd., Tokyo (JP)

( * ) Notice: Subject to any disclaimer, the term of this patent is extended or adjusted under 35 U.S.C. 154(b) by 0 days.

(21) Appl. No.: 13/335,015

(22) Filed: Dec. 22, 2011

(65) Prior Publication Data

US 2012/0153009 A1   Jun. 21, 2012

Related U.S. Application Data

(62) Division of application No. 12/846,496, filed on Jul. 29, 2010, now abandoned.

(30) Foreign Application Priority Data

Aug. 5, 2009 (JP) .................................. 2009-196015
Feb. 23, 2010 (JP) .................................. 2010-056668

(51) Int. Cl.
*H01L 21/58* (2006.01)
*C08L 63/00* (2006.01)
*C09J 163/00* (2006.01)

(52) U.S. Cl.
USPC ........... 438/118; 523/500; 523/455; 523/456; 525/523

(58) Field of Classification Search
None
See application file for complete search history.

(56) References Cited

U.S. PATENT DOCUMENTS

| | | | |
|---|---|---|---|
| 2003/0219619 A1* | 11/2003 | Noro et al. | 428/620 |
| 2005/0158557 A1* | 7/2005 | Noro | 428/413 |
| 2006/0103028 A1* | 5/2006 | Hazeyama et al. | 257/778 |
| 2009/0311827 A1* | 12/2009 | Ishizawa et al. | 438/107 |
| 2012/0168219 A1* | 7/2012 | Kitamura et al. | 174/263 |

FOREIGN PATENT DOCUMENTS

| | | |
|---|---|---|
| JP | 2002-237676 | 8/2002 |
| JP | 2004-152936 | 5/2004 |
| WO | WO 2008010555 A1 * | 1/2008 |

OTHER PUBLICATIONS

Petrie; Handbook of Adhesives and Sealants: Appendix A. 1 Standard Definitions of Terms Relating to Adhesives, 2000.

* cited by examiner

*Primary Examiner* — Michael J Feely
(74) *Attorney, Agent, or Firm* — Clark & Brody

(57) ABSTRACT

Activated resinous composition contains, on the basis of epoxy resin being solid at a room temperature of 100 parts by weight, carboxylic acid compound of 1 to 10 parts by weight, hardening agent of 1 to 30 parts by weight, a hardening reaction initiation temperature of said hardening agent being 150° C. or higher, and solvent of 10 to 300 parts by weight.

13 Claims, 3 Drawing Sheets

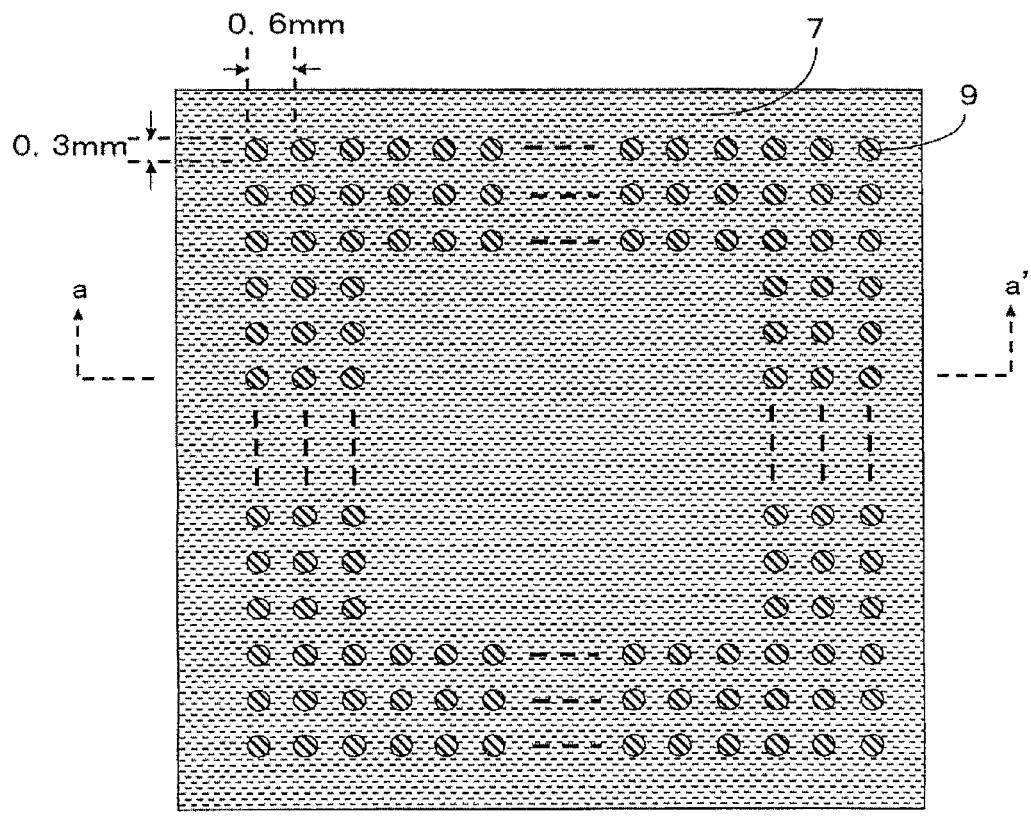
F I G. 2 A
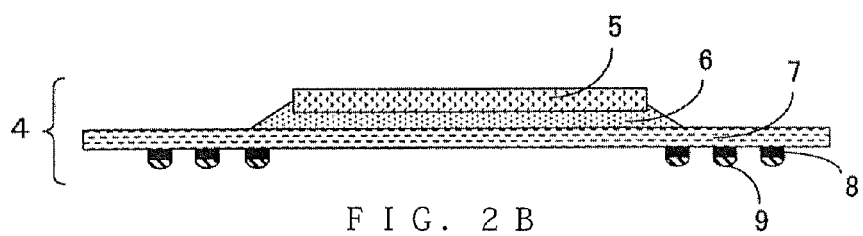
F I G. 2 B

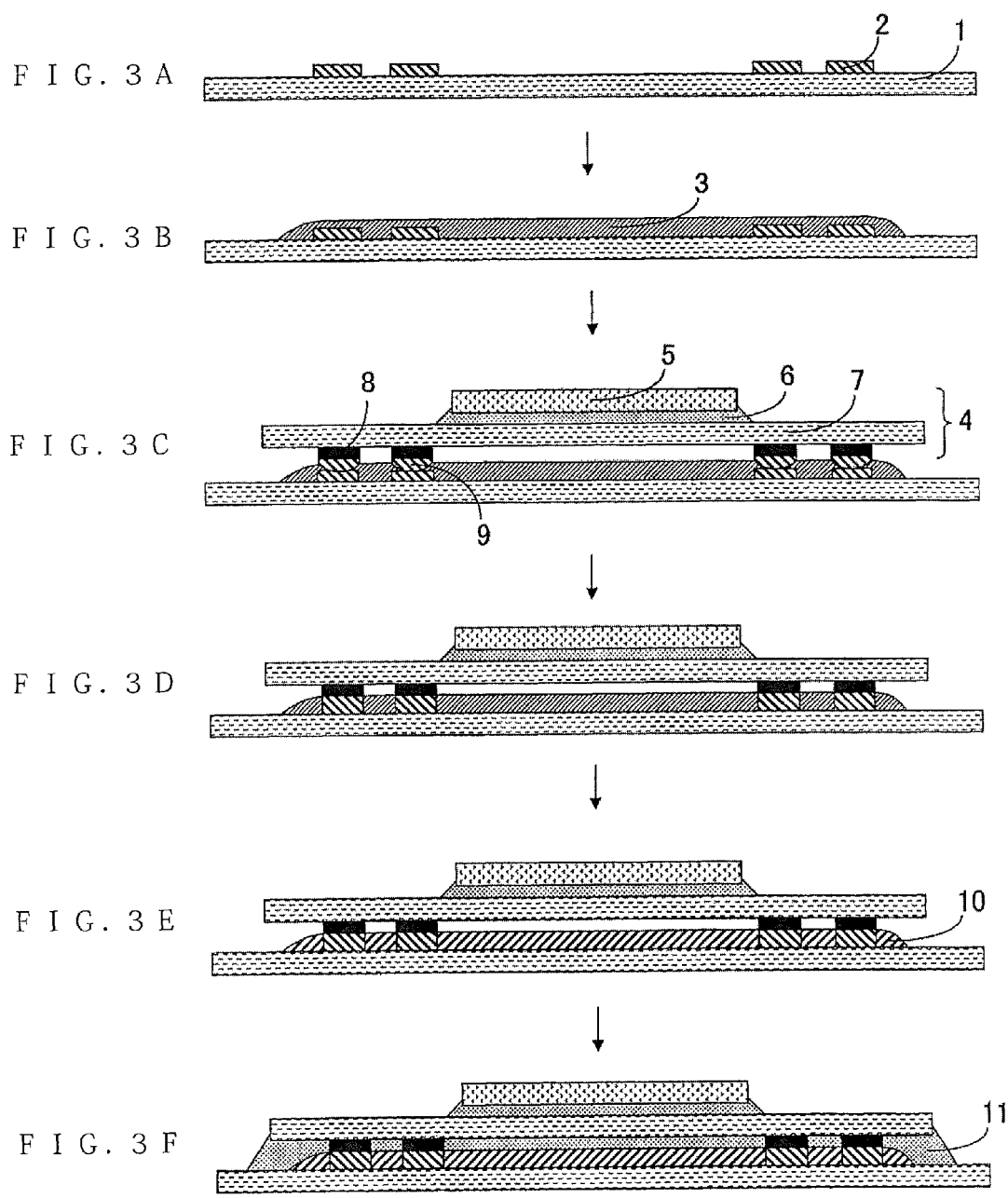

METHOD FOR SURFACE MOUNTING USING CLEANING-FREE ACTIVATED RESINOUS COMPOSITION

BACKGROUND OF THE INVENTION

The present invention relates to an activated resinous composition useful for mounting of flip-chip or the like and a method for surface mounting using this activated resinous composition.

Conventionally, surface mounting technologies for various parts such as BGA parts have been carried out by a method comprising the steps of fluxing a printed wiring board; mounting BGA parts on the printed wiring board; reflow soldering; and cleaning and removing flux; filling space between the printed wiring board and the BGA parts with an underfill resin and hardening the underfill resin. The flux containing a compound having a carboxylic acid such as a rosin resin as an activator is well known (PATENT DOCUMENT 1, claim 2).

Recently, the number of chips mounted on the BGA part tends to increase for functional advancement and a body size of the BGA part correspondingly tends to grow in size.

However, having grown in size, the BAG part itself may interface with the desired cleaning effect and leave unremoved flux (flux residue) behind in the step of cleaning and removing flux. Consequently, there has been possibility that the activator ingredient contained in flux residue might cause corrosion reaction in the subsequent step of heat hardening of the underfill resin.

To overcome such problem, cleaning-free flux (flux free from requirement of cleaning) characterized in that the activator has active force sufficiently low to restrict possibility of corrosion has already been proposed (PATENT DOCUMENT 2). However, when such cleaning-free flux is used, this cleaning-free flux itself may generate cracked gas in the step of heat hardening the underfill resin and, in consequence, destroy the BGA part.

With the BGA part having grown in size, joints in the BGA part may interfere with a desired filling effect in the step of filling the underfill resin. Particularly when there are surface irregularities (e.g., circuit irregularities and/or solder mask irregularities) on the surface of the printed wiring board, it is often impossible to fill every hole and corner of the irregularities completely with the underfill resin and, as a consequence, voids and/or unfilled space may leave behind, significantly deteriorating quality and reliability of the product. Furthermore, if deficiency such as void is overlooked and the subsequent step of hardening the underfill resin, it will be no more possible to repair the product and such faulty product must be scrapped. This leads directly to reduction of yielding percentage.

[PATENT DOCUMENT 1] Japanese Patent Application Laid-Open Publication No. 2004-152936
[PATENT DOCUMENT 2] Japanese Patent Application Laid-Open Publication No. 2002-237676

SUMMARY OF THE INVENTION

In view of the problem as has been described above, it is an object of the present invention to provide an activated resinous composition improved so as to produce effects as will be described below.

1) In a method for surface mounting, a step of flux cleaning can be eliminated not only to reduce a manufacturing cost but also at to improve the productivity.

2) Neither gas bubble nor void space is present in a coated resinous layer after hardened and thus reliability of the product can be improved.

3) The coated resinous layer after hardened exhibits sufficiently high thermal stability to eliminate an apprehension that the coated resinous layer might cause corrosion reaction and/or generate cracked gas on heating (e.g., in the step of heat hardening the underfill resin).

4) Filling of the underfill resin can be facilitated. Consequentially, even when a BGA part having a large body size is mounted, there is no possibility that gas bubble, void or the other unfilled space might be left in regions filled with the underfill resin and hardened. In this way, reliable joint (adhesion) can be assured and reliability of the product can be improved.

The object set forth above is achieved by the present invention developed by the inventor on the basis of experimental findings.

The present invention on a first aspect thereof provides an activated resinous composition containing, on the basis of an epoxy resin being solid at a room temperature of 100 parts by weight, a carboxylic acid compound of 1 to 10 parts by weight, a hardening agent of 1 to 30 parts by weight, a hardening reaction initiation temperature of the hardening agent being 150° C. or higher, and a solvent of 10 to 300 parts by weight.

The present invention on a second aspect thereof provides a method for surface mounting comprising the steps of coating at least soldered surface of a printed wiring board with the activated resinous composition defined by the first aspect of the present invention, loading the printed wiring board with a part to be surface mounted, subjecting this to reflow soldering and heat hardening the coated resinous layer.

The present invention on a third aspect thereof provides a method for surface mounting further including a step of drying and/or heating the coated resinous layer at a temperature corresponding to a softening point or higher but lower than the hardening reaction initiation temperature before the printed wiring board is loaded with the part to be surface mounted.

The present invention on a fourth aspect thereof provides a method for surface mounting further including a step of filling and hardening the underfill resin after the coated resinous layer has been heat hardened.

The activated resinous composition according to the present invention may be used to obtain the effects as will be described below.

1) In the method for surface mounting, a step of flux cleaning can be eliminated not only to reduce a manufacturing cost but also at to improve the productivity.

2) Neither gas bubble nor void space is present in the coated resinous layer after hardened and thus reliability of the product can be improved.

3) The coated resinous layer after hardened exhibits sufficiently high thermal stability to eliminate an apprehension that the coated resinous layer might cause corrosion reaction and/or generate cracked gas on heating (e.g., in the step of heat hardening the underfill resin).

4) Filling of the underfill resin can be facilitated. Consequentially, even when the BGA part having a large body size is mounted, there is no possibility that gas bubble, void or the other unfilled space might be left in regions filled with the underfill resin and hardened. In this way, reliable joint (adhesion) can be assured and reliability of the product can be improved.

BRIEF DESCRIPTION OF THE DRAWINGS

FIG. 2 is a bottom plan view of a BGA part employed in the embodiment of the present invention (A) and a sectional view taken along the line a-a' (B) in FIG. 2A and FIG. 3 is a plurality of sectional views illustrating respective steps of a surface mounting process according to the present invention.

DETAILED DESCRIPTION OF THE PREFERRED EMBODIMENTS

Details of the present invention will be described on the basis of the preferred embodiments.

An activated resinous composition according to the present invention contains an epoxy resin which is solid at room temperature. The epoxy resin functions as a matrix resin. In addition, the epoxy resin also to react with an activator which will be described later in more detail in the course of hardening reaction and thereby to deactivate the activator. Thereby the coated resinous layer after hardened exhibits sufficiently high thermal stability to eliminate an apprehension that the coated resinous layer might cause corrosion reaction and/or generate cracked gas on heating (e.g., in the step of heat hardening the underfill resin). Softening point of the epoxy resin is preferably in a range of 70 to 150 (More preferably in a range of 80 to 100)° C. More specifically, the epoxy resin may be selected from the group consisting of various cresol novorac-type epoxy resins, dicyclopentadiene-based epoxy resins, bisphenol-A-type solid epoxy resins and solid alicyclic epoxy resins.

The activated resinous composition according to the present invention contains a carboxylic compound functioning as an activator. Specifically, the carboxylic compound may be selected from the group consisting of p-hydroxybenzoic acid, dihydroxybenzoic acid, phenylacetic acid, abietic acid, copolymer such as styrene-maleic acid resin and acrylic acid copolymer.

The activated resinous composition according to the present invention contains a hardening agent. A hardening reaction initiation temperature is 150° C. or higher (preferably in a range of 160 to 200° C.).

Specifically, dicyandiamide may be used as the hardening agent.

The activated resinous composition according to the present invention contains a solvent. A boiling point of the solvent is preferably lower than the hardening reaction initiation temperature and more preferably in a range of 150 to 200° C. Specifically, the solvent may be selected from the group consisting of glycol ether, ethylene glycol ether/ester, propylene glycol ether/ester, and N-methylpyrrolidone.

The activated resinous composition according to the present invention may further contain the other additive agents such as polydimethylsiloxane as defoamant, silane coupling agent and aerosol.

The activated resinous composition according to the present invention contains, on the basis of the solid epoxy resin of 100 parts by weight, the ingredients as follows: a carboxylic compound in a range of 1 to 10 (preferably in a range of 2 to 5) parts by weight, a hardening agent in a range of 1 to 30 (preferably in a range of 2 to 7) parts by weight and a solvent in a range of 10 to 300 (preferably in a range of 30 to 100) parts by weight.

A method for surface mounting according to the present invention will be described with reference to the accompanying drawings.

Figure 1A:
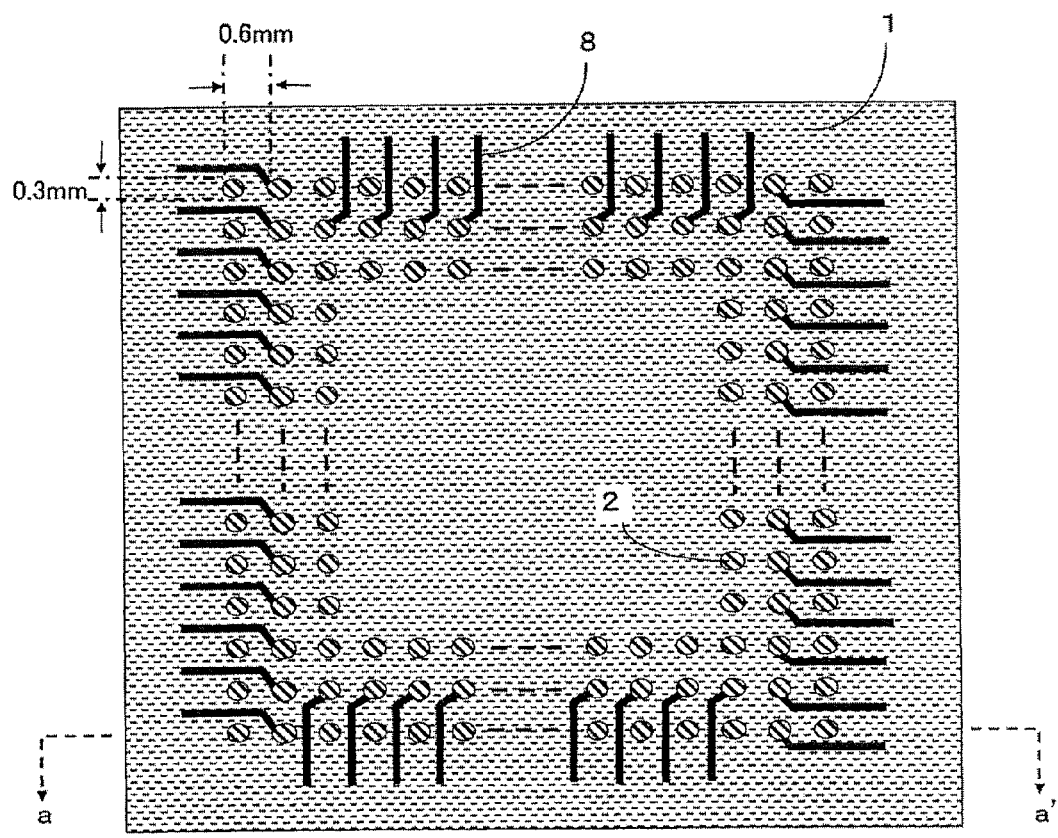
FIG. 1 is a plan view of a printed wiring board employed in an embodiment of the present invention (A) and a sectional view taken along the line a-a' (B) in FIG. 1A.
Figure 1B:
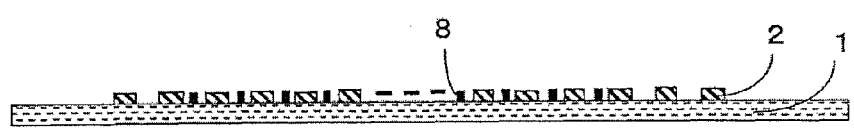

Referring to FIGS. 1A, 1B and FIGS. 2A. 2B, a printed wiring board 1 and a part to be surface mounted 4 are employed in the method. The printed wiring board 1 includes solder pads 2 applied and electric circuits 8 printed on the board. The part 4 to be surface mounted includes a printed wiring board 7, bare ships 5 mounted by intermediary of underfill resin 6 on an surface of the board, and electric circuits 8 printed and solder bump pads 9 applied on the circuits on a lower surface of the board.

Referring to 3A through 3F, in a first step, at least surface of the solder pad 2 (FIG. 3A) on the printed wiring board 1 (FIG. 3A) is coated with an activated resinous composition 3 (FIG. 3B) according to the present invention. Preferably, the entire surface of the printed wiring board or only the solder pad surface only may be coated with the activated resinous composition. It is also possible to coat at least on surfaces of the solder 9 (FIG. 3C) of the part to be surface mounted 4 (FIG. 3C) with the activated resinous composition. In other words, the entire surface of the part to be surface mounted or the solder bump only may be coated with the activated resinous composition. Thickness of the coated resinous layer formed by such coating process is usually in a range of 10 to 50 μm.

Then, the coated resinous layer 3 (FIG. 3B) is dried and the solvent is removed. The coated resinous layer after having been dried normally forms a tack-free coated film. Drying condition may be, for example, 10 to 30 minutes at a temperature of 80 to 120° C.

Then, the coated resinous layer is preferably heated at a temperature higher than the softening point but lower than the hardening reaction initiation temperature of the epoxy resin. With such controlled heating, the coated resinous layer normally develops tackiness and facilitates the parts to be surface mounted. Heating condition may be, for example, 1 to 10 minutes at a temperature in a range of 80 to 130° C.

It should be noted that one or both of the step of drying the coated resinous layer 3 (FIG. 3B) and the step of heating the coated resinous layer at the temperature corresponding to the softening point or higher may be carried out or eliminated. If carried out, these two steps may be carried out successively or at once.

Now the part 4 to be surface mounted (FIG. 3C) is loaded on the printed wiring board. The present invention allows a relatively large part to be surface mounted, for example, a part of 50 mm×50 mm or larger to be handled. Examples of the part to be surface mounted include package parts (e.g., BGA parts, CSP parts, MCM parts, IPM parts and IGBT parts) and semiconductor chips.

The step of loading the part is followed by a step of reflow soldering (FIG. 3D). The step of reflow soldering may be carried out, for example, for a time period in a range of 1 to 10 minutes at a temperature in a range of 240 to 300° C. In the course of this reflow soldering, gas bubble, void or moisture in the coated resinous layer is evacuated in the form of vapor from the coated resinous layer. Consequently, none of such gas bubble, void and moisture is present in the coated resinous layer after hardened.

The step of reflow soldering is followed by a step of heat hardening the coated resinous layer (FIG. 3E). This step of heat hardening may be carried out, for example, for a time period in a range of 1 to 4 hours at a temperature in a range of 150 to 200° C. In this step, the carboxylic acid compound serving as the activator reacts with the epoxy resin to be deactivated. Consequently, there is no more apprehension that the reliability of the product might be deteriorated due to corrosion reaction or the like.

A hardened film (coated resinous layer after hardened) 10 (FIG. 3E) formed in this manner absorbs (planarizes) irregularities on the printed wiring board in some measure and facilitates the subsequent step of filling the underfill resin.

Then, packaging and, if desired, filling and hardening of underfill resin (FIG. 3F, 11) are carried out. Specifically, void spaces left between the printed wiring board and the part to be surface mounted are filled with the underfill resin and this resin is hardened.

Details of the present invention will be further specifically described on the basis of example.

EXAMPLE 1

Homogeneous paste of the activated resinous composition composed of the following ingredients was prepared.

Composition: cresol novolac-type epoxy resin (softening point: 94° C. of 100 parts by weight; p-hydroxybenzoic acid of 4 parts by weight; dicyandiamide of 5 parts by weight; and propylene glycol methyl ether acetate of 50 parts by weight.

Surface of 100 mm×100 mm printed wiring board (pad pitch: 0.6 mm, pad diameter: 0.3 mm) (FIG. 1) was coated with the paste of activated resinous composition by screen printing. This printed wiring board was heated at a temperature of 100° C. for 20 minutes to dry the coated resinous layer. The coated resinous layer on the printed wiring board was cooled to a room temperature to obtain the solid resinous layer having no tackiness and surface's pencil hardness of HB.

Then the printed wiring board was heated to 120° C. to soften the coated resinous layer and develop tackiness. BGA part of 70 mm×70 mm (bump pitch: 0.6 mm; bump diameter: 0.3 mm) was loaded on the printed wiring board. The printed wiring board having BGA part loaded thereon was guided through a reflow apparatus set to a temperature of 260° C. and thereby soldered.

As has previously been described, the printed wiring board having the BGA part soldered thereto was cooled to obtain solid resinous layer having the surface pencil hardness of HB. This solid resinous layer was heated again at a temperature of 120° C. and thereby the resinous layer softened again and the tackiness was developed again.

Then the printed wiring board having the BGA part soldered thereto was heated at a temperature of 190° C. for 2 hours to harden the coated resinous layer. It was confirmed on the basis of measurement after the step of hardening that the coated resinous layer was completely hardened to the surface pencil hardness of 8H.

The BGA part was physically peeled off from a part of the printed wiring board intermediately obtained through the above-described steps and the hardened coated resinous layer was observed using a lens of 20 magnifications. None of voids due to gas babble and/or moisture was observed.

Remaining printed wiring board was filled with the underfill resin and heat at a temperature of 150° C. for 60 minutes to harden the underfill resin. In this manner, the BGA part mounted product was finished. X-ray observation of the finished product indicated that the printed wiring board was completely filled with the underfill resin without the presence of gas babble and/or void.

What is claimed is:

1. A method for surface mounting comprising the steps of:
coating at least soldered surface of a printed wiring board with an activated resinous composition which contains 100 parts by weight of an epoxy resin being solid at a room temperature, 1 to 10 parts by weight of a carboxylic acid compound, 1 to 30 parts by weight of a curing agent, a curing reaction initiation temperature of said curing agent being in a range of 150 to 200° C., and 10 to 300 parts by weight of a solvent;
loading a surface mount component on the printed wiring board resulting in a void space between the coated resinous layer and said surface mount component;
reflow soldering said surface mount component on the printed wiring board by being guided through a reflow apparatus set to a temperature of 240 to 300° C. in 1 to 10 minutes, causing gas bubble, void or moisture to be evacuated in the form of vapor from the coated resinous layer and yielding a coated resinous layer capable of developing tackiness when subsequently cooled and reheated to a temperature higher than the softening temperature of the coated resinous layer but lower than the curing reaction initiation temperature; and
heat curing the coated resinous layer.

2. The method for surface mounting defined by claim 1 further including a step of drying and/or heating the coated resinous layer before the printed wiring board is loaded with the surface mount component, wherein
the coated resinous layer is dried at a temperature of 80 to 120° C. in 10-30 minutes; and
the coated resinous layer is heated in 1-10 minutes at a temperature of 80 to 130° C. corresponding to a softening point or higher of the coated resinous layer but lower than the curing reaction initiation temperature.

3. The method for surface mounting defined by claim 2 further including a step of filling and curing underfill resin in said void space between said coated resinous layer and said surface mount component after the coated resinous layer has been heat cured.

4. The method for surface mounting defined by claim 1 further including a step of filling and curing underfill resin in said void space between said coated resinous layer and said surface mount component after the coated resinous layer has been heat cured.

5. The method for surface mounting defined by claim 1 wherein a softening point of said epoxy resin is in a range of 80 to 100° C.

6. The method for surface mounting defined by claim 1, wherein said epoxy resin is selected from the group consisting of cresol novolac-type epoxy resins, dicyclopentadiene-based epoxy resins, bisphenol-A-type solid epoxy resins, and solid alicyclic epoxy resins.

7. The method for surface mounting defined by claim 1, wherein said carboxylic compound is selected from the group consisting of p-hydroxybenzoic acid, dihydroxybenzoic acid, phenylacetic acid, abietic acid, styrene-maleic acid copolymer, and acrylic acid copolymer.

8. The method for surface mounting defined by claim 1, wherein the curing reaction initiation temperature of said curing agent is in a range of 160 to 200° C.

9. The method for surface mounting defined by claim 1, wherein said curing agent is dicyandiamide.

10. The method for surface mounting defined by claim 1, wherein a boiling point of the solvent is lower than the curing reaction initiation temperature.

11. The method for surface mounting defined by claim 1, wherein said solvent is selected from the group consisting of glycol ether, ethylene glycol ester, propylene glycol ester, and N-methylpyrrolidone.

12. The method for surface mounting defined by claim 1, wherein said activated resinous composition further contains an additive agent, wherein said additive agent includes one of polydimethylsiloxane as defoamant, silane coupling agent, and aerosol.

13. The method for surface mounting defined by claim 1, wherein said surface mount component includes one of BGA parts, CSP parts, MCM parts, IPM parts, IGBT parts, and semiconductor chips.

* * * * *